(12) United States Patent
She et al.

(10) Patent No.: US 12,184,979 B2
(45) Date of Patent: Dec. 31, 2024

(54) CAMERA MODULE HAVING OPTICAL IMAGE STABILIZATION FUNCTION, AND PREPARATION METHOD THEREFOR

(71) Applicants: Avary Holding (Shenzhen) Co., Limited., Shenzhen (CN); QING DING PRECISION ELECTRONICS (HUAIAN) CO., LTD, Huai an (CN)

(72) Inventors: Xue-Feng She, Shenzhen (CN); Qiang Song, Shenzhen (CN); Mei-Hua Huang, Shenzhen (CN); Ning Hou, Shenzhen (CN)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 0 days.

(21) Appl. No.: 18/034,351

(22) PCT Filed: Jun. 29, 2021

(86) PCT No.: PCT/CN2021/102916
§ 371 (c)(1),
(2) Date: Apr. 27, 2023

(87) PCT Pub. No.: WO2023/272462
PCT Pub. Date: Jan. 5, 2023

(65) Prior Publication Data
US 2023/0379583 A1 Nov. 23, 2023

(51) Int. Cl.
H04N 23/54 (2023.01)
G03B 5/00 (2021.01)
(Continued)

(52) U.S. Cl.
CPC ............. *H04N 23/687* (2023.01); *G03B 5/00* (2013.01); *H04N 23/51* (2023.01); *H04N 23/54* (2023.01);
(Continued)

(58) Field of Classification Search
CPC ...... H04N 23/687; H04N 23/51; H04N 23/54; H04N 23/6812; H04N 23/55; H04N 23/57;
(Continued)

(56) References Cited

U.S. PATENT DOCUMENTS 10,637,974 B2 * 4/2020 Zeng ..................... G06F 1/1624
2019/0356826 A1 * 11/2019 Chung .................. H04N 23/54
(Continued)

FOREIGN PATENT DOCUMENTS

CN 102809796 A 12/2012
CN 112637469 A 4/2021
(Continued)

*Primary Examiner* — Mekonnen D Dagnew
(74) *Attorney, Agent, or Firm* — ScienBiziP, P.C.

(57) ABSTRACT

A camera module having OIS function and its preparation method are provided. The camera module includes a housing and an optical assembly in the housing, and further includes a circuit board in the housing. The circuit board includes a first board and a second board on the first board. The first board is flexible. The first board includes a first portion, a second portion, and a third portion successively connected in an extending direction of the first board. The second portion defines a slot. The second board is on the third portion. The optical assembly is on the second board. The first portion includes a fixed end connecting the second portion and an opposite free end. The housing defines a through hole. The first portion extends through the slot to form a bent portion and extends out of the through hole, such that the free end is outside the housing.

20 Claims, 7 Drawing Sheets

(51) Int. Cl.
  *H04N 23/51* (2023.01)
  *H04N 23/68* (2023.01)
(52) U.S. Cl.
  CPC ............... *G03B 2205/0007* (2013.01); *G03B 2205/0069* (2013.01); *H04N 23/6812* (2023.01)
(58) Field of Classification Search
  CPC .............. G03B 5/00; G03B 2205/0007; G03B 2205/0069; H05K 1/147; H05K 2201/10121
  See application file for complete search history.

(56) References Cited

U.S. PATENT DOCUMENTS

2021/0014346 A1\* 1/2021 Choi .................... H04M 1/0277
2023/0379582 A1\* 11/2023 Wang ....................... G03B 5/00

FOREIGN PATENT DOCUMENTS

| CN | 112637470 A | 4/2021 |
| CN | 112637471 A | 4/2021 |

\* cited by examiner

CAMERA MODULE HAVING OPTICAL IMAGE STABILIZATION FUNCTION, AND PREPARATION METHOD THEREFOR

FIELD

The subject matter herein generally relates to imaging, and more particularly, to a camera module with an optical image stabilization function and a preparation method for the camera module.

BACKGROUND

Electronic devices such as tablets, phones, or smartwatches are generally equipped with camera modules. When a user uses an electronic device to capture images, shaking of the hands may result in blurry images. A camera module with an optical image stabilization (OIS) function can reduce blurriness in the captured images caused by shaking of hands to a certain extent. The OIS technology detects small movements within the camera module through a gyroscope, transmits the signal to a microprocessor that calculates the displacement to be compensated, and then compensates the position of the lens according to the displacement to be compensated and the shaking direction of the lens.

However, in the above optical image stabilization process, a flexible circuit electrically connect the camera module to the motherboard may also move together with the lens. Thus, the resistance to the motion of the camera module is increased. Moreover, continuous stretching of the flexible circuit can lead to problems such as breakage or poor electric contact, which affects the reliability of the product.

SUMMARY

To overcome the above shortcomings, a camera module with an optical image stabilization function is needed.

In addition, a preparation method for the camera module is also needed.

The present application provides a preparation method for a camera module, including providing a circuit board, wherein the circuit board includes a first board and a second board formed on the first board, the first board is a flexible circuit board, the first board includes a first portion, a second portion, and a third portion sequentially connected to each other in an extending direction of the first board, the second portion defines a slot, the second board is formed on the third portion, the first portion includes a fixed end connecting the second portion and a free end opposite to the fixed end; installing an optical assembly on the second board to obtain an intermediate body; providing a housing, wherein the housing defines a through hole; extending the first portion in the intermediate body through the slot to form a bent portion, and placing the intermediate body with the bent portion inside the housing; and further extending the first portion which has extended through the slot out of the through hole, causing the free end to be located outside the housing, thereby obtaining the camera module.

In some possible implementations, after extending the first portion out of the through hole, the preparation method further includes forming an adhesive between the through hole and the first portion.

In some possible implementations, the housing is provided withs a bottom wall, a top wall, and at least two sidewalls each connected between the bottom wall and the top wall, one of the at least two sidewalls defines the through hole. The housing is further provided with an isolation plate located between the at least two sidewalls, the isolation plate divides an interior space of the housing into a first receiving space and a second receiving space, the first receiving space communicate with the through hole, such that the bent portion is located in the first receiving space, the optical assembly, the second board, and the third portion of the first board are located in the second receiving space.

In some possible implementations, providing the circuit board comprises providing a circuit substrate, wherein the circuit substrate includes the first board, an adhesive layer, and the second board stacked together, the second board is formed on the first portion, the second portion, and the third portion, the adhesive layer defines an opening corresponding to the first portion and the second portion; removing areas of the second board corresponding to the first and the second portions, thereby obtaining the circuit board.

The present application further provides a camera module, including a housing, an optical assembly located in the housing, and a circuit board located in the housing. The circuit board includes a first board and a second board formed on the first board, the first board is a flexible circuit board, the first board includes a first portion, a second portion, and a third portion sequentially connected to each other in an extending direction of the first board, the second portion defines a slot, the second board is formed on the third portion, the optical assembly is installed on the second board. The first portion includes a fixed end connecting the second portion and a free end opposite the fixed end, the housing defines a through hole, the first portion extends through the slot to form a bent portion, the first portion further extends out of the through hole to cause the free end to be located outside the housing.

In some possible implementations, the bent portion is formed by bending the first portion by at least two circles.

In some possible implementations, a height of the bent portion is smaller than a thickness of the housing in a thickness direction of the first board.

In some possible implementations, the camera module further includes an adhesive between the through hole and the first portion.

In some possible implementations, the housing includes a bottom wall, a top wall, and at least two sidewalls each connected between the bottom wall and the top wall, one of the at least two sidewalls defines the through hole. The housing further includes an isolation plate located between the at least two sidewalls, the isolation plate divides an interior space of the housing into a first receiving space and a second receiving space, the first receiving space communicate with the through hole, the bent portion is located in the first receiving space, the optical assembly, the second board, and the third portion of the first board are located in the second receiving space.

In some possible implementations, in a width direction of the first board, a width of the first portion is smaller than a width of the second portion, and the width of the second portion is equal to a width of the third portion.

In the present application, since the flexible circuit board includes the bent portion, the bent portion can be stretched to a certain extent when the camera module performs the optical image stabilization function. Thus, the resistance to the motion of the camera module can be reduced. The risk of the first board generating breakage or poor contact with the main board during the stretching process can also be reduced.

Numeric of Main Components

Figure 1:
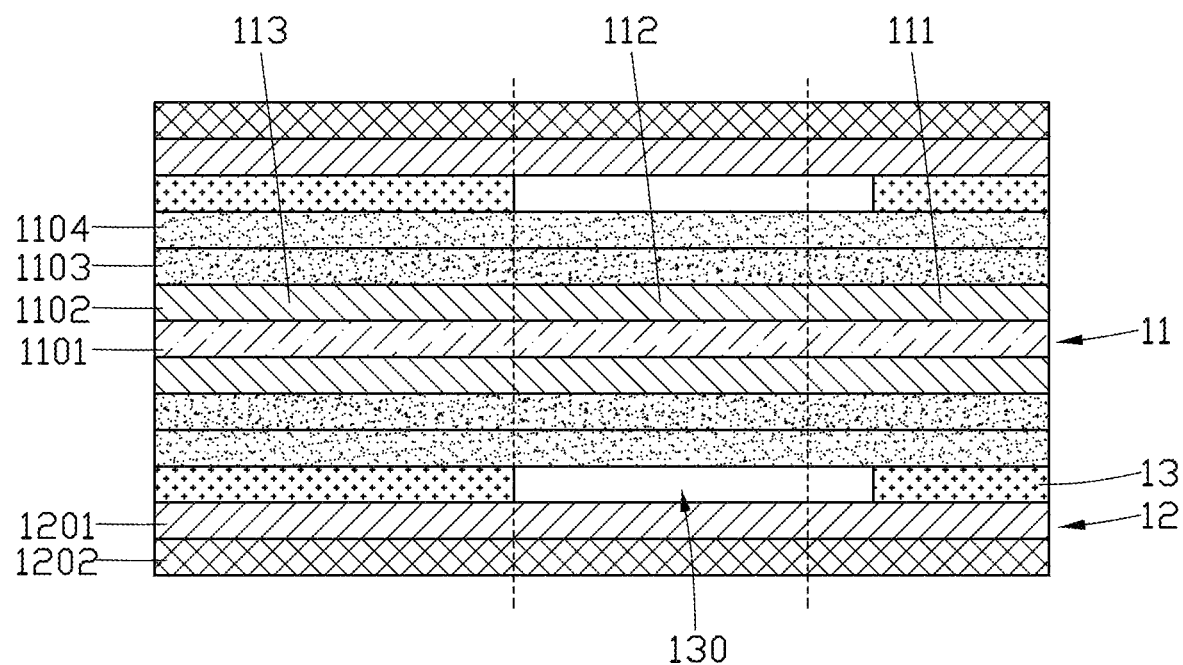
FIG. 1 is a cross-sectional view of a circuit substrate according to an embodiment of the present application.
Figure 1:
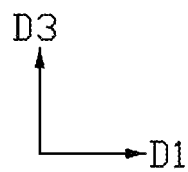

Camera module 1; intermediate body 2; circuit substrate 10; first Board 11; second Board 12; second adhesive layer 13; optical assembly 20; photosensitive chip 21; bracket 22; filter 23; lens unit 24; coil 25; magnetic component 26; housing 30; bottom wall 31; top wall 32; sidewall 33; isolation plate 34; adhesive 40; circuit board 100; first portion 111; second portion 112; third portion 113; electrical connection portion 114; opening 130; lens base 241; lens 242; first receiving space 301; second receiving space 302; aperture 320; through hole 330; base layer 1101; first wiring layer 1102; first adhesive layer 1103; first covering layer 1104; bent portion 1110; slot 1120; second wiring layer 1201; second covering layer 1202; fixed end A; free end B; wiring E; length direction D1; width direction D2; thickness direction D3; height R; thickness H; width W1, W2, W3, or W4.

Implementations of the present disclosure will now be described, by way of embodiments, with reference to the attached figures.

DETAILED DESCRIPTION

Implementations of the disclosure will now be described, by way of embodiments only, with reference to the drawings. It should be noted that non-conflicting details and features in the embodiments of the present disclosure may be combined with each other. In the following description, many specific details are provided to facilitate a full understanding of the embodiments of the present application. The described embodiments are a portion of the embodiments instead of all embodiments of the present application.

Unless otherwise defined, all technical terms used herein have the same meaning as commonly understood by one of ordinary skill in the art. The technical terms used herein are not to be considered as limiting the scope of the embodiments.

An embodiment of the present application provides a preparation method for a camera module. According to different requirements, the sequence of different steps of the preparation method can be changed, and certain steps can be omitted or combined with each other. The preparation method includes the following steps:

Step S1, referring to FIG. 1, a circuit substrate 10 is provided. The circuit substrate 10 includes a first board 11 and a second board 12 formed on the first board 11. The first board 11 is a flexible circuit board. In an extending direction of the first board 11 (i.e., a length direction D1), the first board 11 includes a first portion 111, a second portion 112, and a third portion 113 sequentially connected to each other. The second board 12 can be installed on each of the first portion 111, the second portion 112, and the third portion 113.

In some embodiments, the second board 12 is a rigid circuit board. The second board 12 is provided on each of two opposite surfaces of the first board 11. In other embodiments, the second board 12 may also be a flexible circuit board.

Furthermore, the first board 11 includes a base layer 1101. The first board 11 further includes a first wiring layer 1102, a first adhesive layer 1103, and a first covering layer 1104 successively formed on a surface of the base layer 1101. Each second board 12 is bonded to the first covering layer 1104 through a second adhesive layer 13. Each second board 12 includes a second wiring layer 1201 and a second covering layer 1202. The second wiring layer 1201 is located between the second covering layer 1202 and the second adhesive layer 13. That is, the circuit substrate 10 has four wiring layers. However, it can be understood that in other embodiments, the number of wiring layers of the circuit substrate 10 may also be increased or reduced as needed, which is not limited.

The second adhesive layer 13 defines an opening 130 that extends through the second adhesive layer 13. The opening 130 corresponds to the first portion 111 and the second portion 112.

Figure 2A:
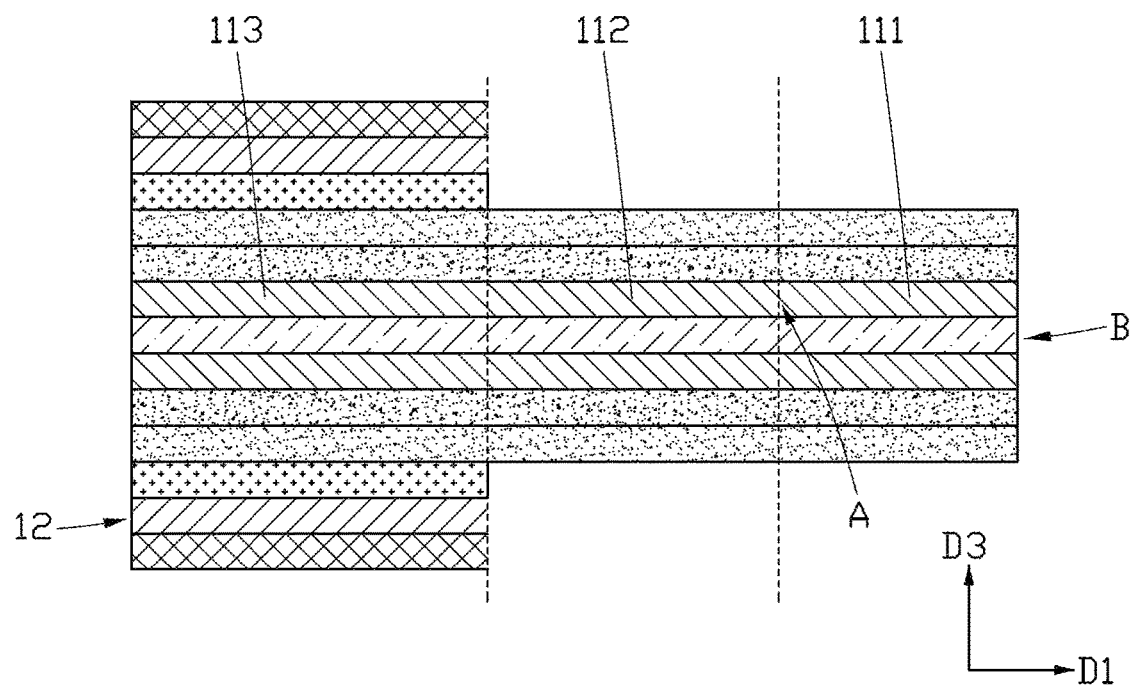
FIG. 2A is a cross-sectional view showing the circuit substrate of FIG. 1 with certain portions being removed.
Figure 2B:
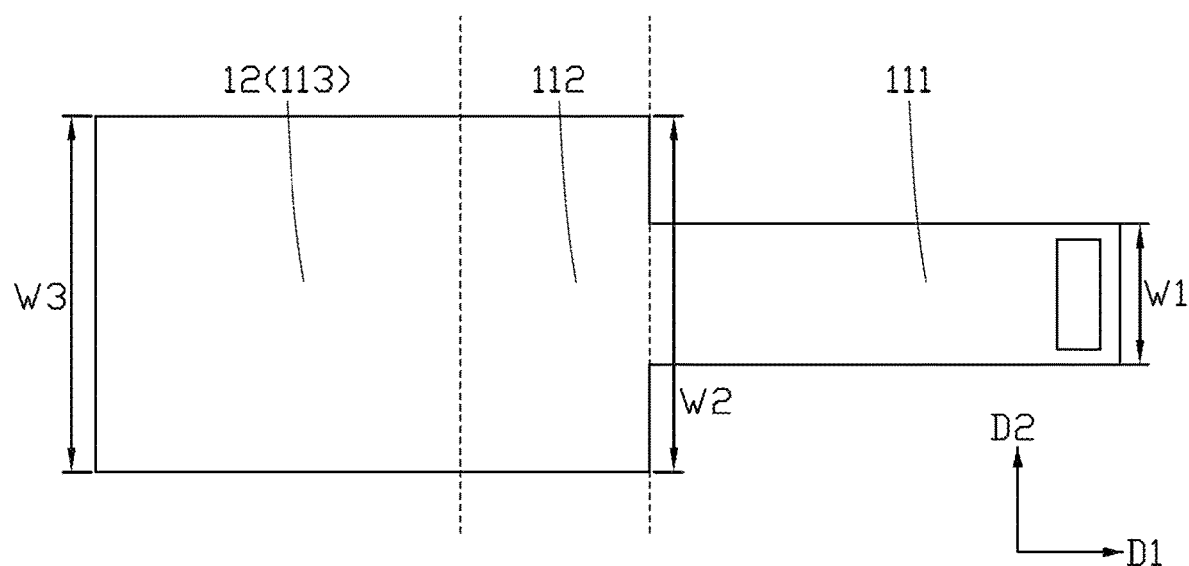
FIG. 2B is a top view of the circuit substrate of FIG. 2A.

Step S2, referring to FIGS. 2A and 2B, areas of the second board 12 corresponding to the first portion 111 and the second portion 112 are removed (i.e., a decapping process), so that each of the first portion 111 and the second portion 112 is exposed from the second board 12.

The first portion 111 includes a fixed end A connecting the second portion 112 and a free end B opposite to the fixed end A.

As shown in FIG. 2B, in some embodiments, in a width direction D2 of the first board 11, a width W1 of the first portion 111 is smaller than a width W2 of the second portion 112, and the width W2 of the second portion 112 is equal to a width W3 of the third portion 113. The first portion 111 extends from a substantially center area of a side of the second portion 12 away from the third portion 113.

Figure 3A:
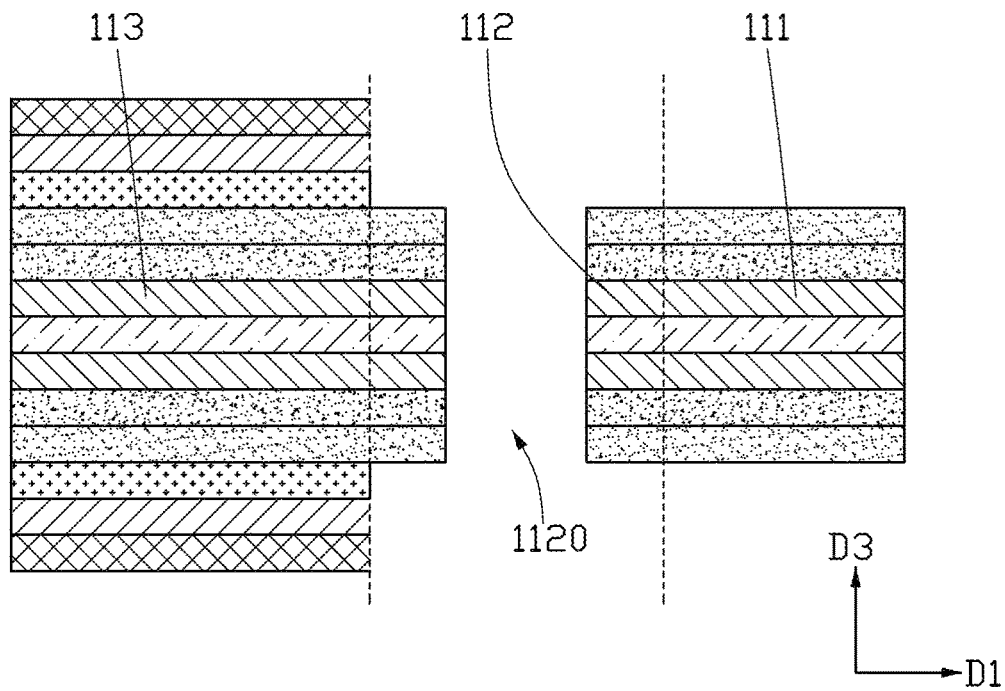
FIG. 3A is a cross-sectional view showing a slot defined in the circuit board of FIG. 2A.
Figure 3B:
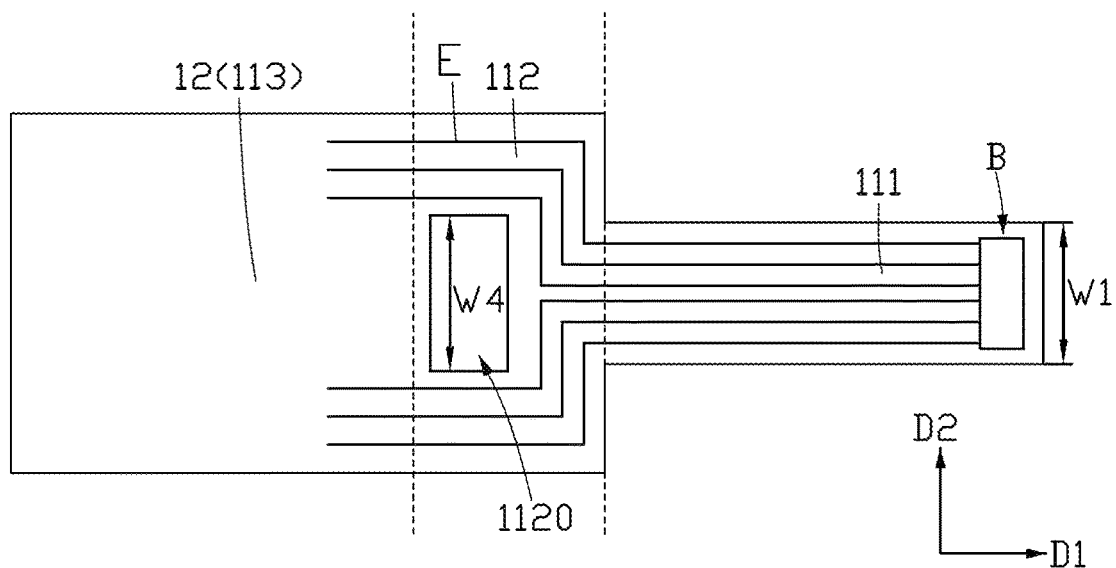
FIG. 3B is a top view of the circuit board of FIG. 3A.

Step S3, referring to FIGS. 3A and 3B, a slot 1120 is defined in the second portion 112, and the slot 1120 extends through the second portion 112. Then, a circuit board 100 is obtained. When the second board 12 is a rigid circuit board, the obtained circuit board 100 is rigid-flexible circuit board.

As shown in FIG. 3B, in some embodiments, in the width direction D2 of the first board 11, a width W4 of the slot 1120 is greater than the width W1 of the first portion 111, so that a gap (not shown) is formed between the slot 1120 and the free end B. As such, the friction force between the free end B and the slot 1120 can be reduced when the first portion 111 passes through the slot 1120 in the subsequent step. A width of the gap may be substantially 1 mm.

It can be understood that the wirings E of the first wiring layer 1102 of the first board 11 bypass the slot 1120, so damages to the wiring patterns can be avoided when defining the slot 1120.

Figure 4A:
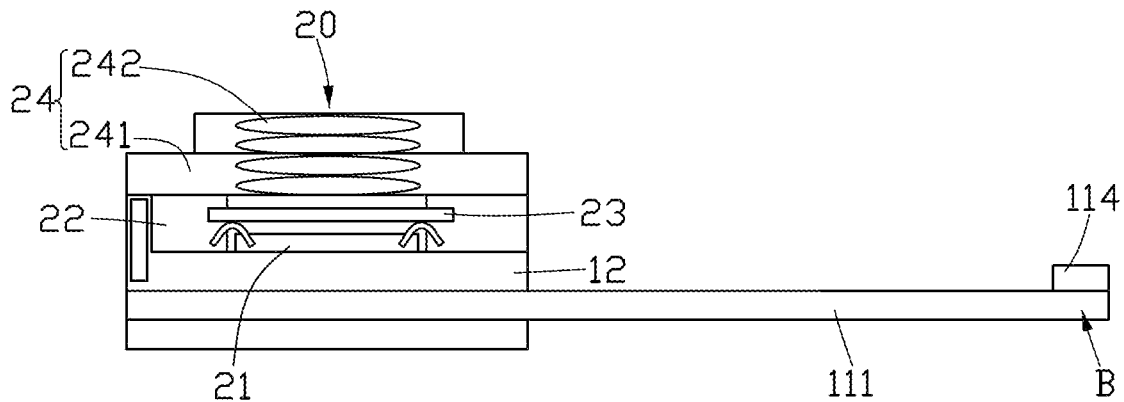
FIG. 4A is a cross-sectional view showing an optical assembly installed on the circuit board of FIG. 3A to obtain an intermediate body.
Figure 4B:
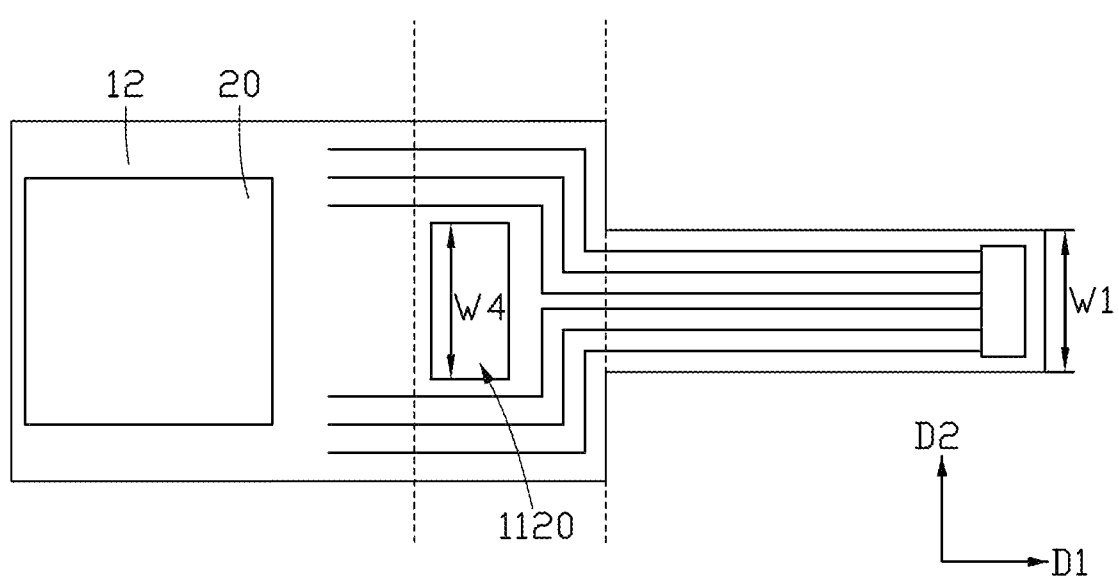
FIG. 4B is a top view of the intermediate body of FIG. 4A.

Step S4, referring to FIGS. 4A and 4B, an optical assembly 20 is installed on the second board 12 to obtain an intermediate body 2.

In some embodiments, the optical assembly 20 includes a photosensitive chip 21, a bracket 22, a filter 23, and a lens unit 24. The photosensitive chip 21 and the bracket 22 are both installed on the second board 12. The photosensitive chip 21 is received in the bracket 22. The lens unit 24 is installed on the bracket 22. The bracket 22 is arranged between the lens unit 24 and the second board 12. The filter 23 is arranged in the bracket 22. The lens unit 24 includes a lens base 241 and a lens 242 arranged in the lens base 241. The lens base 241 is formed on the bracket 22. The lens base 241 can be integrally formed or assembled together with the lens 242. The filter 23 is arranged between the photosensitive chip 21 and the lens 242. The filter 23, the photosensitive chip 21, and the lens 242 faces each other.

In some embodiments, an electrical connection portion 114 may also be installed at the free end B of the first portion 111. The electrical connection portion 114 is used to electrically connect the circuit board 100 to an external motherboard (not shown). The electrical connection portion 114 may be a connector or gold fingers.

Figure 5:
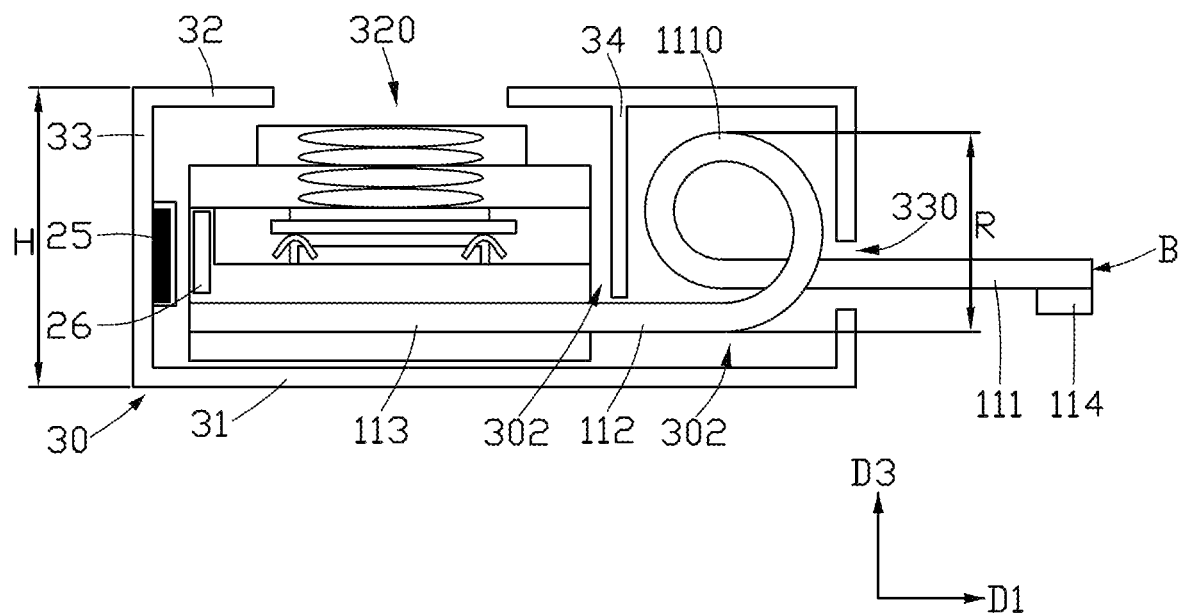
FIG. 5 is a cross-sectional view showing the intermediate body of FIG. 4A placed inside a housing and a free end of the circuit board extended out of a through hole of the housing.

Step S5, referring to FIG. 5, a housing 30 is provided. The housing 30 includes a bottom wall 31, a top wall 32, and four sidewalls 33 connected between the bottom wall 31 and the top wall 32. One of the sidewalls 33 defines a through hole 330. The first portion 111 of the intermediate body 2 passes through the slot 1120 to form a bent portion 1110, and the intermediate body 2 with the bent portion 1110 is placed inside the housing 30. Furthermore, the first portion 111 that has extended through the slot 1120 further extends out of the through hole 330 of the sidewall 33, so that the free end B is located outside the housing 30.

Since the free end B is located outside the housing 30, the circuit board 100 can be conveniently connected to the external motherboard through the electrical connection portion 114 located at the free end B.

In some embodiments, the top wall 32 defines an aperture 320 facing to the lens 242 of the lens unit 24, thereby allowing external light to successively pass through the aperture 320, the lens 242, and the filter 23 and then be imaged on the photosensitive chip 21.

In some embodiments, as shown in FIG. 5, the bent portion 1110 is formed by bending the first portion 111 by one circle. The bent portion 1110 has a height R, which is defined as a dimension of the bent portion 1110 in the direction from the bottom wall 31 to the top wall 32 (i.e., a thickness direction D3 of the first board 11). It can be understood that the height R of the bent portion 1110 is smaller than the thickness H of the housing 30 (i.e., a distance between the top wall 32 and the bottom wall 31), thereby avoiding an increase of the thickness of the camera module 1 after setting the bent portion 1110. I In another embodiment, the bent portion 1110 may also be formed by bending the first portion 111 by two circles. Taking the bent portion 1110 formed by bending by two circles for example, the free end B of the first portion 111 can be extended through the slot 1120 twice during the preparation, thereby obtaining the bent portion 1110. In practical applications, the number of bending circles and the height of the bent portion 1110 may be changed as needed.

In some embodiments, the housing 30 further includes an isolation plate 34 located between two sidewalls 33. The isolation 34 divides the interior space of the housing 30 into a first receiving space 301 and a second receiving space 302. The first receiving space 301 communicates with the through hole 330. The bent portion 1110 is located in the first receiving space 301. The optical assembly 20, the second board 12 of the circuit board 100, and the third portion 113 of the first board 11 are all located in the second receiving space 302. A portion of the second portion 112 of the first board 11 is located in the first receiving space 301, and the other portion of the second portion 112 is located in the second receiving space 302.

In some embodiments, the optical assembly 20 further includes a coil 25 and a magnetic component 26. The coil 25 is located on one of the sidewalls 33 without the through hole 330 and away from the bent portion 1110. The coil 25 is electrically connected to the circuit board 100. Accordingly, the magnetic component 26 can be installed on the sidewall of the bracket 22. The circuit board 100 is used to energize the coil 25 when the optical assembly 20 shakes. When the coil 25 is energized, an attractive force is generated between the magnetic component 26 and the coil 25, which drives the optical assembly 20 to move towards the coil 25. At the same time, since the first portion 111 is connected to the external motherboard, a tension is generated between the first portion 111 and the optical assembly 20, which drives the optical assembly 20 to move towards the first portion 111. The attractive force between the magnetic component 26 and the coil 25 and the tensile force of the first portion 111 cooperatively compensate for the shaking of optical assembly 20.

Figure 6:
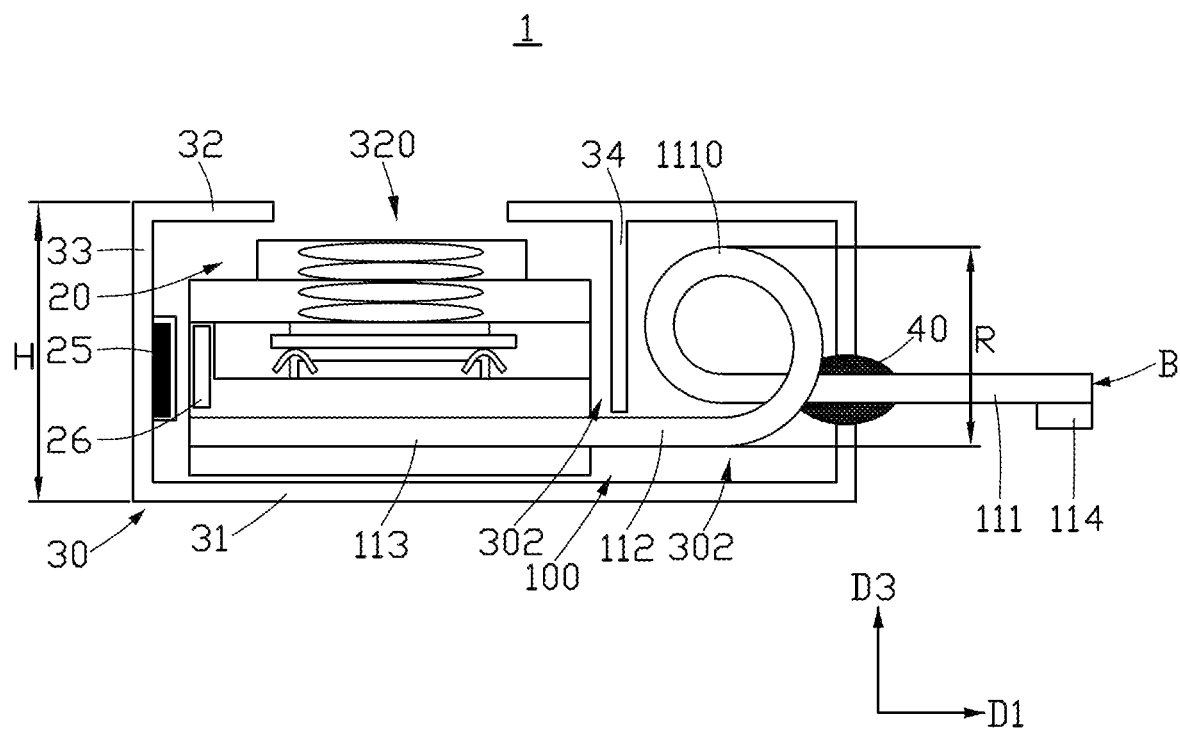
FIG. 6 is a cross-sectional view showing the free end of FIG. 5 fixed in the through hole of the housing to obtain a camera module.

Step S6, referring to FIG. 6, an adhesive 40 is formed between the through hole 330 and the first portion 111, which fixes the first portion 111 in the through hole 330. Then, the camera module 1 is obtained.

Figure 7:
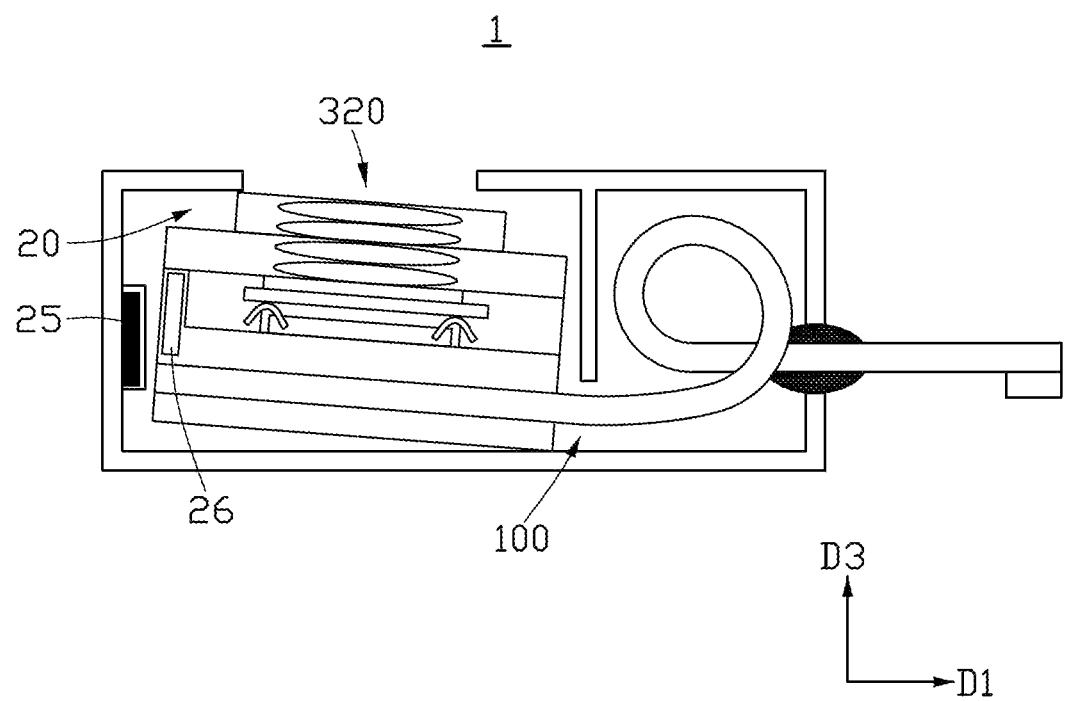
FIG. 7 is a cross-sectional view of the camera module shown in FIG. 6 in another state.

Specifically, as shown in FIG. 7, if the optical assembly 20 shakes clockwise by a certain angle, the coil 25 is energized, causing the magnetic component 26 corresponding to the coil 25 to drive the optical assembly 20 to move to the left side. At the same time, the first portion 111 pulls the optical assembly 20 to move to the right side, causing the optical assembly 20 to rotate counterclockwise, thereby compensating for the shaking of the optical assembly 20 clockwise. Therefore, the optical axis of the lens 242 can always face the aperture 320. In some embodiments, the camera module 1 may further include a gyroscope (not shown) and a control chip (not shown). The gyroscope can be installed on the second board 12 or the optical assembly 20, which is used to sense whether the optical assembly 20 is tilted. The control chip controls the circuit board 100 to start or stop energizing the coil 25 according to the sensing results of the gyroscope.

In the present application, since the flexible circuit board 100 includes the bent portion 1110, the bent portion 1110 can be stretched to a certain extent when the camera module 1 performs the optical image stabilization function. Thus, the resistance to the motion of the camera module 1 can be reduced. The risk of the first board 11 generating breakage or poor contact with the main board during the stretching process can also be reduced.

Referring to FIG. 6, an embodiment of the present application further provides a camera module 1, which includes a housing 30, a circuit board 100, and an optical assembly 20.

The housing 30 includes a bottom wall 31, a top wall 32, and four sidewalls 33 connected between the bottom wall 31 and the top wall 32. One of the sidewalls 33 defines a through hole 330.

The circuit board 100 includes a first board 11 and a second board 12 formed on the first board 11. The first board 11 is a flexible circuit board 100. In the length direction D1 of the first board 11, the first board 11 includes a first portion 111, a second portion 112, and a third portion 113 that are sequentially connected to each other. The second board 12 is located on the third portion 113. That is, the first portion 111 and the second portion 112 are exposed from the second board 12. The optical assembly 20 is installed on the second board 12. The second portion 112 includes a slot 1120 that extends through the second portion 112.

The first portion 111 includes a fixed end A connected to the second portion 112 and a free end B opposite to the fixed end A. The first portion 111 passes through the slot 1120 to form a bent portion 1110. The optical assembly 20 and the circuit board 100 are received inside the housing 30. The first portion 111 that extends through the slot 120 further extends through the through hole 330 of the sidewall 33, so that the free end B is located outside the housing 30.

In some embodiments, along the width direction D2 of the first board 11, the width W1 of the first portion 111 is smaller than the width W2 of the second portion 112, and the width W2 of the second portion 112 is equal to the width W3 of the third portion 113. The first portion 111 extends from a substantially center area of a side of the second portion 12 away from the third portion 113.

In the width direction D2 of the first board 11, the width W4 of the slot 1120 is greater than the width W1 of the first portion 111, resulting in a gap generated between the slot 1120 and the free end B. The width of the gap may be substantially 1 mm.

In some embodiments, the bent portion 1110 is formed by bending the first portion 111 by one circle. The bent portion 1110 has a height R, which is defined as the dimension of the bent portion 1110 along the thickness direction D3 of the first board 11. It can be understood that the height R of the bent portion 1110 is smaller than the thickness H of the camera module 1 (i.e., the thickness of the housing 30), thereby avoiding an increase of the thickness of the camera module 1 after setting the bent portion 1110. In another embodiment, the bent portion 1110 may also be formed by bending the first portion 111 by two circles.

In some embodiments, the housing 30 further includes an isolation plate 34 located between two sidewalls 33. The isolation 34 divides the interior space of the housing 30 into a first receiving space 301 and a second receiving space 302. The first receiving space 301 communicates with the through hole 330. The bent portion 1110 is located in the first receiving space 301. The optical assembly 20, the second board 12 of the circuit board 100, and the third portion 113 of the first board 11 are all located in the second receiving space 302. A portion of the second portion 112 of the first board 11 is located in the first receiving space 301, and the other portion of the second portion 112 is located in the second receiving space 302.

In some embodiments, the optical assembly 20 further includes a coil 25 and a magnetic component 26. The coil 25 is located on one of the sidewalls 33 without the through hole 330 and away from the bent portion 1110. The coil 25 is electrically connected to the circuit board 100. Accordingly, the magnetic component 26 can be installed on the sidewall of the bracket 22. The circuit board 100 is used to energize the coil 25 when the optical assembly 20 shakes. When the coil 25 is energized, an attractive force is generated between the magnetic component 26 and the coil 25, which drives the optical assembly 20 to move towards the coil 25. At the same time, since the first portion 111 is connected to the external motherboard, a tension is generated between the first portion 111 and the optical assembly 20, which drives the optical assembly 20 to move towards the first portion 111. The attractive force between the magnetic component 26 and the coil 25 and the tensile force of the first portion 111 cooperatively compensate for the shaking of optical assembly 20.

In some embodiments, an adhesive 40 is arranged between the through hole 330 and the first portion 111, which is used to fix the first portion 111 in the through hole 330.

In some embodiments, an electrical connection portion 114 may also be installed at the free end B of the first portion 111. The electrical connection portion 114 is used to electrically connect the circuit board 100 to the external motherboard. The electrical connection portion 114 may be a connector or gold fingers.

Finally, it should be noted that the above embodiments are only used to illustrate but not to limit the technical solution of the present application. Although the present application has been described in detail with reference to the embodiments, one having ordinary skill in the art should understand that the technical solution of the present application can be modified or changed into equivalents, which still do not depart from the spirit and scope of the present application.

What is claimed is:

1. A preparation method for a camera module, comprising:
    providing a circuit board, wherein the circuit board comprises a first board and a second board formed on the first board, the first board is a flexible circuit board, the first board comprises a first portion, a second portion, and a third portion sequentially connected to each other in an extending direction of the first board, the second portion defines a slot, the second board is formed on the third portion, the first portion comprises a fixed end connecting the second portion and a free end opposite to the fixed end;
    installing an optical assembly on the second board to obtain an intermediate body;
    providing a housing, wherein the housing defines a through hole;
    extending the first portion in the intermediate body through the slot to form a bent portion, and placing the intermediate body with the bent portion inside the housing; and
    further extending the first portion which has extended through the slot out of the through hole, causing the free end to be located outside the housing, thereby obtaining the camera module.

2. The preparation method for the camera module according to claim 1, after extending the first portion out of the through hole, the preparation method further comprising:
    forming an adhesive between the through hole and the first portion.

3. The preparation method for the camera module according to claim 1, wherein the housing is provided with a bottom wall, a top wall, and at least two sidewalls each connected between the bottom wall and the top wall, one of the at least two sidewalls defines the through hole, and
    the housing is further provided with an isolation plate located between the at least two sidewalls, the isolation plate divides an interior space of the housing into a first receiving space and a second receiving space, the first receiving space communicate with the through hole, such that the bent portion is located in the first receiving space, the optical assembly, the second board, and the third portion of the first board are located in the second receiving space.

4. The preparation method for the camera module according to claim 3, wherein the optical assembly comprises a photosensitive chip, a bracket, a filter, and a lens unit; and installing the optical assembly on the second board comprising installing the photosensitive chip and the bracket on the second board, wherein the photosensitive chip is received in the bracket; the lens unit is installed on the bracket; the bracket is arranged between the lens unit and the second board; the filter is arranged in the bracket.

5. The preparation method for the camera module according to claim 4, wherein the optical assembly is further provided with a coil and a magnetic component; and the optical assembly is installed on the second board by placing the coil on one of the at least two sidewalls that without the through hole and away from the bent portion; electrically connecting the coil to the circuit board; and installing the magnetic component on the bracket, so that the circuit board is configured to energize the coil when the optical assembly shakes.

6. The preparation method for the camera module according to claim 1, wherein providing the circuit board comprises:

providing a circuit substrate, wherein the circuit substrate comprises the first board, an adhesive layer, and the second board stacked together, the second board is formed on the first portion, the second portion, and the third portion, the adhesive layer defines an opening corresponding to the first portion and the second portion; and removing areas of the second board corresponding to the first and the second portions, thereby obtaining the circuit board.

7. The preparation method for the camera module according to claim 1, further comprising forming a gap by extending the first portion through the slot, wherein in a width direction of the first board, a width of the slot is greater than a width of the first portion, such that the gap is formed between the slot and the free end.

8. The preparation method for the camera module according to claim 1, wherein providing the circuit board further comprising arranging wirings of the first board to bypass the slot.

9. The preparation method for the camera module according to claim 1, further comprising installing an electrical connection portion at the free end.

10. A camera module comprising:

a housing;

an optical assembly located in the housing; and a circuit board located in the housing, wherein the circuit board comprises a first board and a second board formed on the first board, the first board is a flexible circuit board, the first board comprises a first portion, a second portion, and a third portion successively connected to each other in an extending direction of the first board, the second portion defines a slot, the second board is formed on the third portion, the optical assembly is installed on the second board;

wherein the first portion comprises a fixed end connecting the second portion and a free end opposite the fixed end, the housing defines a through hole, the first portion extends through the slot to form a bent portion, the first portion further extends out of the through hole to cause the free end to be located outside the housing.

11. The camera module according to claim 10, wherein the bent portion is formed by bending the first portion by at least two circles.

12. The camera module according to claim 10, wherein a height of the bent portion is smaller than a thickness of the housing in a thickness direction of the first board.

13. The camera module according to claim 10, further comprising an adhesive between the through hole and the first portion.

14. The camera module according to claim 10, wherein the housing comprises a bottom wall, a top wall, and at least two sidewalls each connected between the bottom wall and the top wall, one of the at least two sidewalls defines the through hole;

the housing further comprises an isolation plate located between the at least two sidewalls, the isolation plate divides an interior space of the housing into a first receiving space and a second receiving space, the first receiving space communicate with the through hole, such that the bent portion is located in the first receiving space, the optical assembly, the second board, and the third portion of the first board are located in the second receiving space.

15. The camera module according to claim 14, wherein the optical assembly comprises a photosensitive chip, a bracket, a filter, and a lens unit; the photosensitive chip and the bracket are located on the second board, the photosensitive chip is received in the bracket; the lens unit is installed on the bracket; the bracket is arranged between the lens unit and the second board; the filter is arranged in the bracket.

16. The camera module according to claim 15, wherein the optical assembly further comprises a coil and a magnetic component; the coil is located on one of the at least two sidewalls that without the through hole and away from the bent portion; the coil is electrically connected to the circuit board; the magnetic component is installed on the bracket, so that the circuit board is configured to energize the coil when the optical assembly shakes.

17. The camera module according to claim 10, wherein in a width direction of the first board, a width of the first portion is smaller than a width of the second portion, and the width of the second portion is equal to a width of the third portion.

18. The camera module according to claim 10, wherein in a width direction of the first board, a width of the slot is greater than a width of the first portion, such that a gap is formed between the slot and the free end.

19. The camera module according to claim 10, wherein wirings of the first board bypass the slot.

20. The camera module according to claim 10, wherein an electrical connection portion is located at the free end.

* * * * *